US007010388B2

(12) United States Patent
Mitchell et al.

(10) Patent No.: US 7,010,388 B2
(45) Date of Patent: Mar. 7, 2006

(54) WORK-PIECE TREATMENT SYSTEM HAVING LOAD LOCK AND BUFFER

(75) Inventors: Robert J. Mitchell, Winchester, MA (US); Allan D. Weed, Marblehead, MA (US); Richard Gueler, Beverly, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/444,019

(22) Filed: May 22, 2003

(65) Prior Publication Data

US 2004/0234359 A1 Nov. 25, 2004

(51) Int. Cl.
G06F 7/00 (2006.01)
(52) U.S. Cl. .............. 700/218; 700/248; 414/939; 414/941
(58) Field of Classification Search ........... 700/213, 700/218, 245, 248 X; 414/217, 995, 939, 414/940, 941
See application file for complete search history.

(56) References Cited

U.S. PATENT DOCUMENTS

| 5,003,183 A | 3/1991 | Nogami et al. |
| 5,019,233 A * | 5/1991 | Blake et al. ........... 204/192.12 |
| 5,357,115 A * | 10/1994 | Asakawa et al. ...... 250/442.11 |
| 5,486,080 A | 1/1996 | Sieradzki |
| 5,685,684 A * | 11/1997 | Kato et al. ................ 414/217 |
| 6,244,811 B1 * | 6/2001 | Kroeker et al. ............ 414/217 |
| 6,350,097 B1 | 2/2002 | Mitchell et al. |
| 6,428,262 B1 * | 8/2002 | Vanderpot et al. ......... 414/217 |
| 6,450,750 B1 * | 9/2002 | Heyder et al. ............. 414/217 |
| 6,481,956 B1 * | 11/2002 | Hofmeister ................. 414/806 |
| 6,519,504 B1 * | 2/2003 | Soraoka et al. ............ 700/228 |
| 6,555,825 B1 | 4/2003 | Mitchell et al. |
| 6,719,517 B1 * | 4/2004 | Beaulieu et al. ........... 414/217 |
| 6,722,835 B1 * | 4/2004 | Stevens et al. ............. 414/217 |
| 6,746,195 B1 * | 6/2004 | Shirai ........................ 414/217 |

\* cited by examiner

*Primary Examiner*—Khoi H. Tran
(74) *Attorney, Agent, or Firm*—Watts Hoffmann Co. L.P.A.

(57) ABSTRACT

A transfer system for use with a tool for treating a work-piece at sub-atmospheric pressure such as an ion implanter for implanting silicon wafers. An enclosure defines a low pressure region for treatment of work-pieces placed at a work-piece treatment station within the low pressure region. Multiple work-piece isolation load locks transfer work-pieces, one or two at a time, from a higher pressure region to the lower pressure for treatment and back to said higher pressure subsequent to said treatment. A first robot transfers work-pieces within the low pressure region from the load locks to a treatment station within the low pressure region. Multiple other robots positioned outside the low pressure region transfers work-pieces to and from the multiple work-piece isolation load locks from a source of said work-pieces prior to treatment and to a destination of said work-pieces after said treatment.

15 Claims, 7 Drawing Sheets

WORK-PIECE TREATMENT SYSTEM HAVING LOAD LOCK AND BUFFER

FIELD OF THE INVENTION

The present invention concerns a system for moving a work-piece to and from an evacuated sub-atmospheric region of a tool that treats the work-piece at sub-atmospheric pressure.

BACKGROUND ART

Axcelis Technologies, assignee of the present invention, designs and sells products for treatment of silicon wafers during integrated circuit fabrication. One such product or tool is sold under the designation MC-3. This tool creates an ion beam that modifies the physical properties of wafers that are placed into the ion beam. This process can be used, for example, to dope the silicon from which the untreated wafer is made to produce a semiconductor material. Controlled use of masking with resist materials prior to ion implantation as well as layering of different dopant patterns within the wafer produce an integrated circuit for use in one of a myriad of applications.

A variety of other tools are used during integrated circuit fabrication. These tools include rapid thermal processing of wafers under controlled conditions to anneal the wafers. Other tools are used to apply photoresist in controlled patterns onto the wafers. Tools are used to remove photoresist materials from the wafers during an ashing process. Other tools are used to cut the treated wafers into individual integrated circuits.

An ion implantation chamber of an ion beam implanter such as a model MC-3 implanter is maintained at reduced pressure. Subsequent to acceleration along a beam line, the ions in the beam enter the implantation chamber and strike the wafer. In order to position the wafer within the ion implantation chamber, they are moved by a robot into a load lock from a cassette or storage device delivered to the implanter by a conveyor system or by other means of delivery.

Front opening unified pods have become a popular mechanism for moving silicon wafers from one workstation to another in an integrated circuit (IC) fabrication facility. Different versions of these pods are commercially available from different manufacturers including Asyst Technologies and Brooks Automation. A front opening unified pod (or FOUP) containing a number of stacked wafers is delivered from one tool to a next subsequent tool by an automated delivery device such as an overhead transport. The overhead transport deposits the pod to a location within the reach of a robot so that a robotic arm can extract one or more silicon wafers from the pod for treatment.

U.S. Pat. No. 5,486,080 to Sieradzki concerns a system for high speed movement of work-pieces in vacuum processing. The system employs two wafer transport robots for moving wafers from two load locks past a processing station. Additional patents relating to serial end stations are U.S. Pat. Nos. 6,350,097, 6,555,825, and 5,003,183.

Certain known ion implantation sequences require that the work-piece be implanted with ions multiple times with different ion beam formulas or recipes in a so-called chaining sequence. Chaining sequences are most efficiently performed by keeping the work-piece in the vacuum chamber for the entire sequence of recipes. The present invention concerns a transfer method and apparatus for efficiently moving work-pieces into and out of a vacuum (sub-atmospheric) chamber for work-piece processing.

SUMMARY OF THE INVENTION

A system is disclosed for use with a tool, such as an ion implanter for treating a work-piece at sub-atmospheric pressure. Transfer apparatus used with the tool includes a work-piece isolation load lock for transferring one or two work-pieces at a time from higher pressure to lower pressure and back to the higher pressure. At the lower pressure a buffer stores a plurality of work-pieces at the lower pressure in positions accessible for transfer into and out of the buffer. A robot transfers work-pieces from the work-piece load lock to the buffer or to a work-piece treatment station maintained at the lower pressure. The disclosed system has application for use with a chained sequence of implants in an ion implanter since the buffer allows partially treated wafers to be stored in the buffer at the lower pressure.

An exemplary system can rapidly serially treat multiple work-pieces at sub-atmospheric pressure. This treatment is performed by optionally aligning an untreated work-piece at a work-piece alignment station and then moving the untreated work-piece from the alignment station to a first loadlock and moving the untreated work-piece into an interior of the first loadlock. The first loadlock is evacuated to reduce the pressure within the loadlock and then the untreated work-piece is removed from within the first loadlock interior with an in-vacuum robot. An already treated work-piece that has been removed from a treatment station by a second set of arms of the in-vacuum robot is placed into a loadlock. The untreated work-piece is then moved to the treatment station by the in-vacuum robot as the second loadlock is pressurized. The treated work-piece is removed from the loadlock for subsequent processing. Efficient high level throughput is achieved by use of such a system.

These and other objects advantages and features of the invention will be understood from a review of a detailed description of alternate exemplary embodiments of the invention which are described in conjunction with the accompanying drawings.

EXEMPLARY EMBODIMENT FOR PRACTICING THE INVENTION

Figure 1:
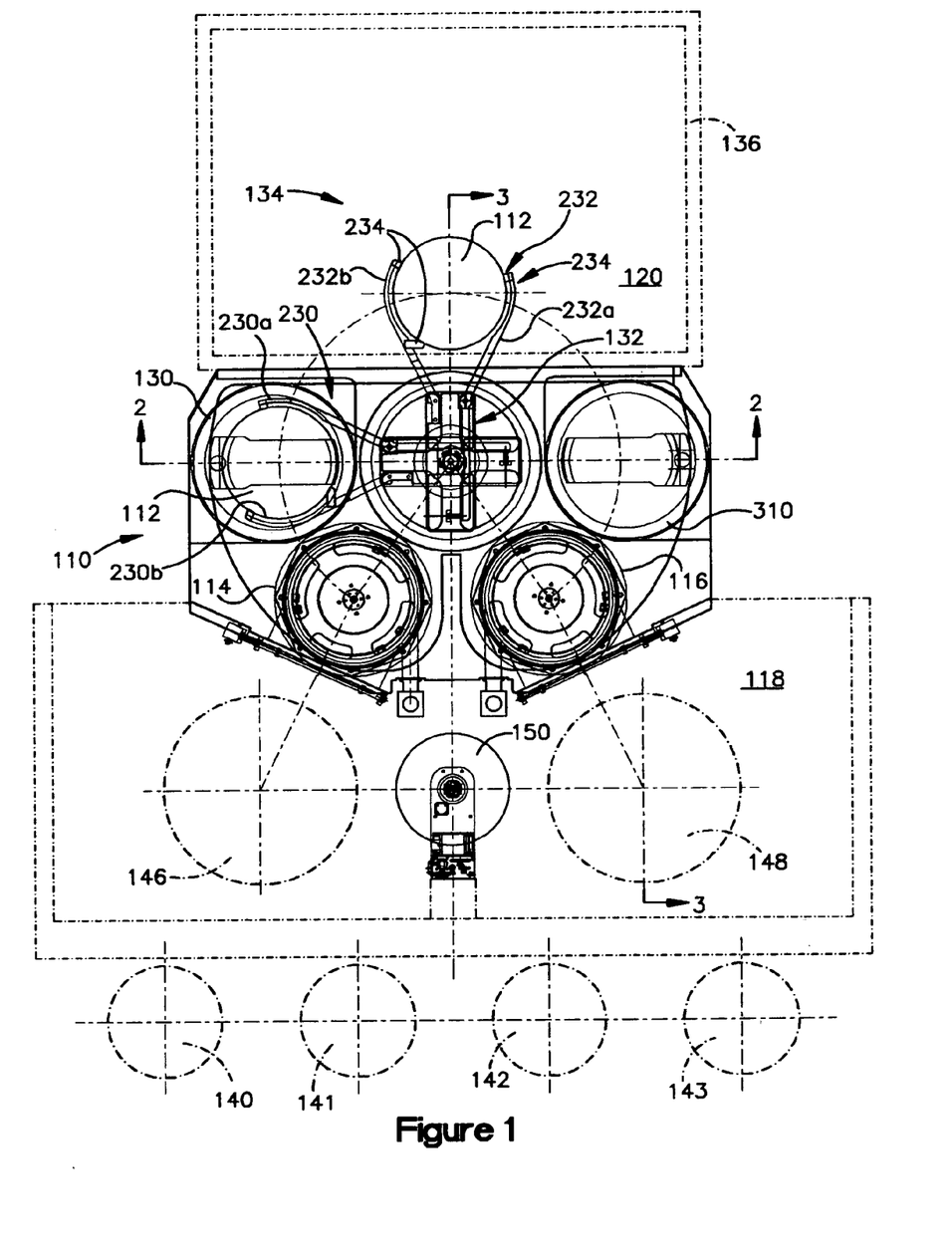
FIG. 1 is a top view of an ion implanter end station for loading work-pieces into an ion implanter and removing treated work-pieces from an ion implanter.

Turning now to the drawings, FIG. 1 depicts an end station 110 for use with a ion beam treatment tool for treating a work-piece, such as a semiconductor wafer 112 at sub-atmospheric pressure. The end station includes first and second work-piece isolation load locks 114, 116 each capable of transferring one or two work-pieces at a time from a region 118 of higher pressure (typically atmospheric pressure) to a region 120 of lower pressure and back to the region 118 of higher pressure. One application of the end station depicted in FIG. 1 is for serially implanting one semiconductor wafer at a time with ions from an ion beam that enters an ion implantation chamber 136. During such semiconductor wafer treatment, a recipe for the implant may require that the wafer be treated multiple times by beams having different energies and intensities. When such chained recipes are required, it is an advantage to be able to store the wafers in the low pressure region 120 while other wafers receive treatment with the first recipe in the implantation chamber 136.

The FIG. 1 end station 110 includes a storage buffer 130 for storing a plurality of work-pieces at the lower pressure within the low pressure region 120 in positions within the buffer accessible for transfer by a robot 132 that moves wafers into and out of the storage buffer 130. The robot 132 is also positioned for transferring work-pieces from either of the work-piece load locks 114, 116 to the buffer 130 as they first enter the region of low pressure. In treatment recipes where no buffering is needed, the robot 132 can also transfer the wafers from one of the two load locks 114, 116 directly to a treatment station 134. The robot 132 places the wafer onto a wafer chuck 135 which attracts the work-piece to secure it to the chuck. The chuck and work-piece are then moved into position within the ion beam. As seen in FIG. 3A, the chuck 135 is rotated to another orientation through an angle of approximately ninety degrees and scanned back and forth as indicated by the arrow 137 through an ion beam 138 at the treatment station 134. The two limits of this scan movement are shown in FIG. 3A. In accordance with an exemplary embodiment of the invention, the ion beam 138 is scanned from side to side by electrodes up stream along the beam path before it reaches the ion implantation chamber. Other means of implanting a wafer without resort to side to side scanning are also known in the art. The side to side scanning creates a fan shaped beam. This shape in combination with the scanning of the work-piece up and down as indicated by the arrow 137 treats an entire surface of the workpiece and in the exemplary embodiment of a thin planar semiconductor wafer.

After beam treatment by the ion beam the robot 132 retrieves the work-piece and moves the treated work-piece directly back into a load lock for transfer back to the higher pressure region. If the load lock accommodates two work-pieces, the robot 132 can move the second workpiece to the buffer 130. Once the first work-piece is treated, it can be moved to the buffer and the second work-piece grasped and placed at the treatment station while the treated work-piece is moved back to one of the load locks 114, 116. In the disclosed embodiment, the robot 132 includes two sets of workpiece grasping arms and in this embodiment the second wafer can be held by the robot while a first work-piece is being treated.

The exemplary embodiment of the invention is used in conjunction with an ion implanter for ion beam treatment of semiconductor wafers in an integrated circuit fabrication facility. FIG. 1 schematically depicts four front opening unified pods 140–143 used to move silicon wafers from one tool to another in such an integrated circuit (IC) fabrication facility. An overhead transport (not shown) has deposited each of these four pods to a position in relation to the end station 110 within the reach of one of two in air robots 146, 148 so that a robotic arm can extract one or more silicon wafers from the pod for treatment. The in air robot that grasps a wafer moves it into a load lock but before doing so may optionally place the wafer onto an aligner 150 which orients the wafer in a proper orientation prior to inserting the wafer into the load lock.

Figure 2:
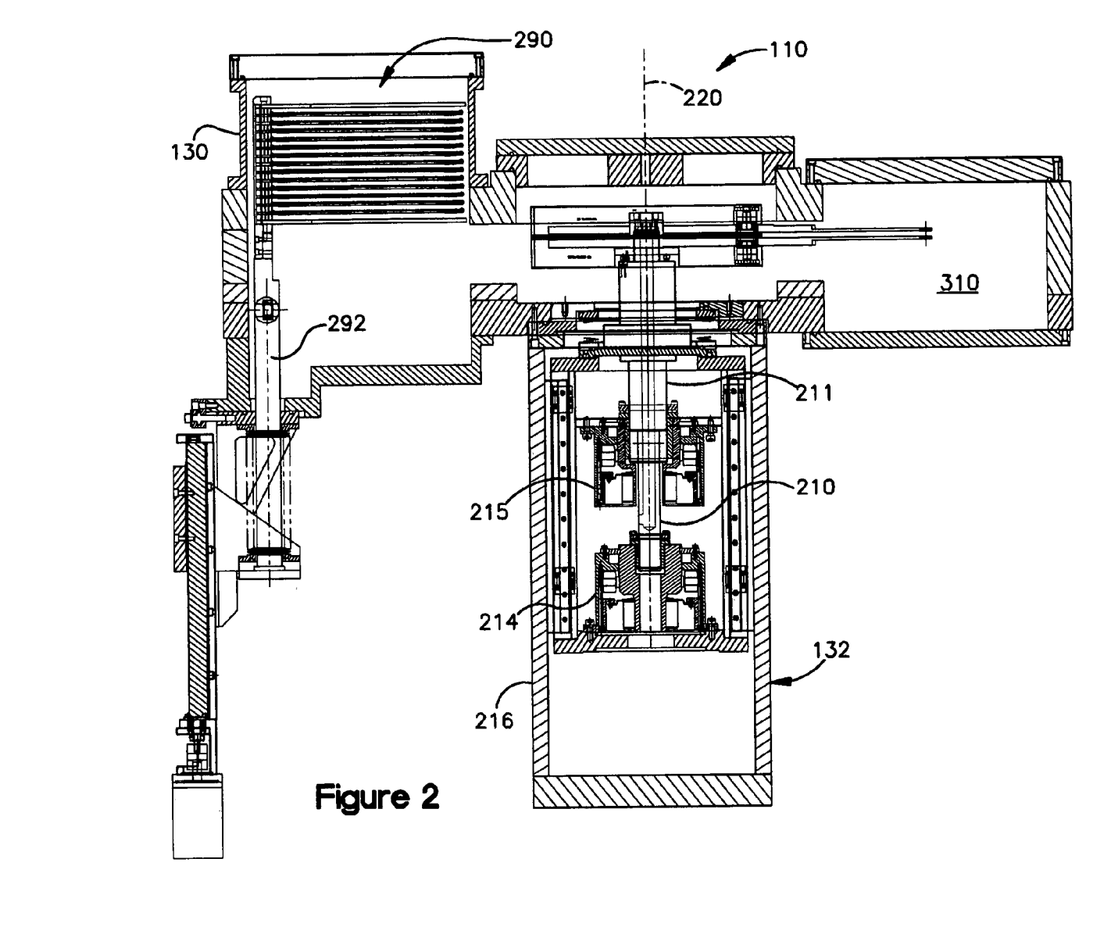
FIG. 2 is a section view as seen from the line 2—2 in FIG. 1.
Figure 3:
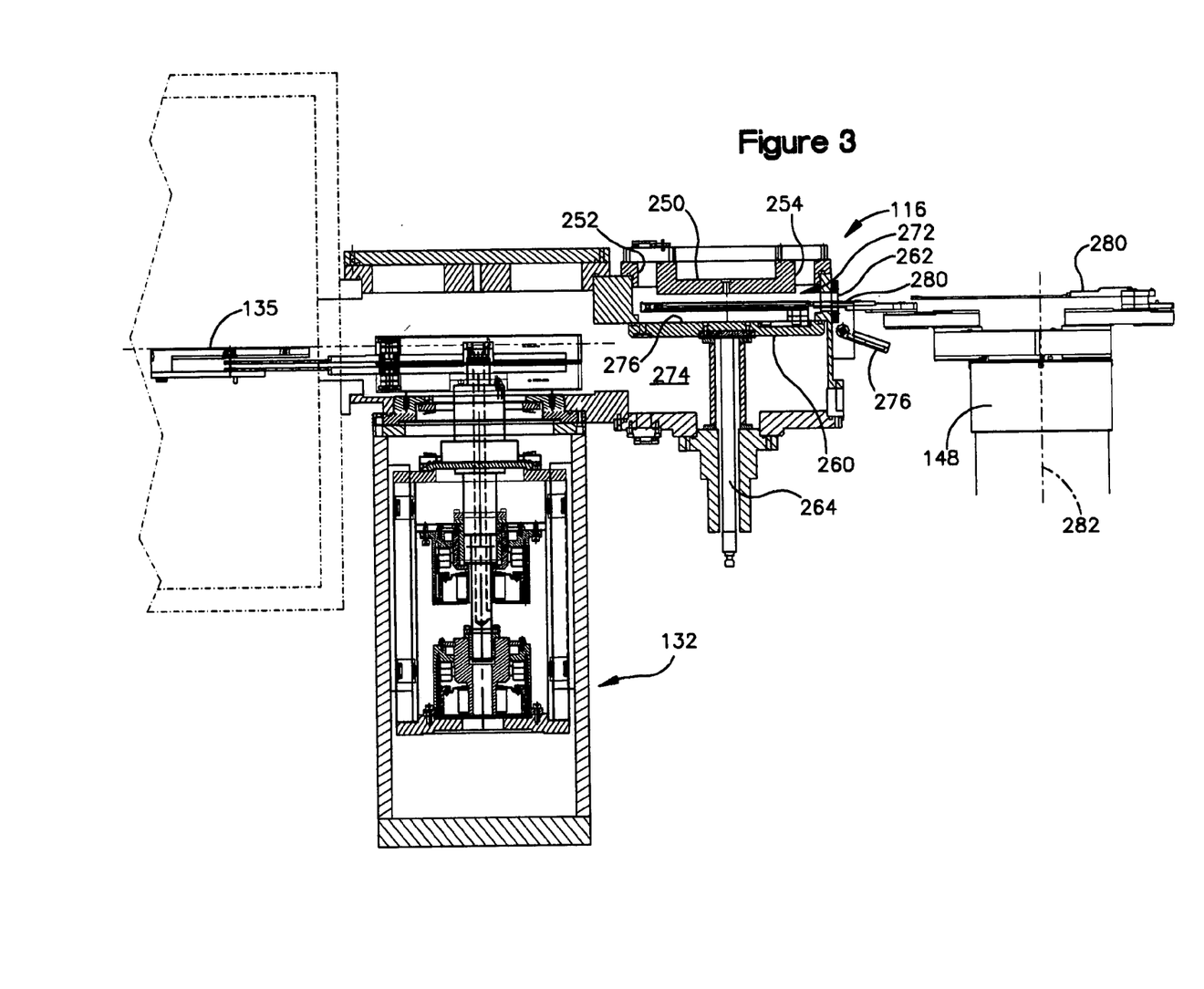
FIG. 3 is a section view as seen from the line 3—3 of FIG. 1.
Figure 3A:
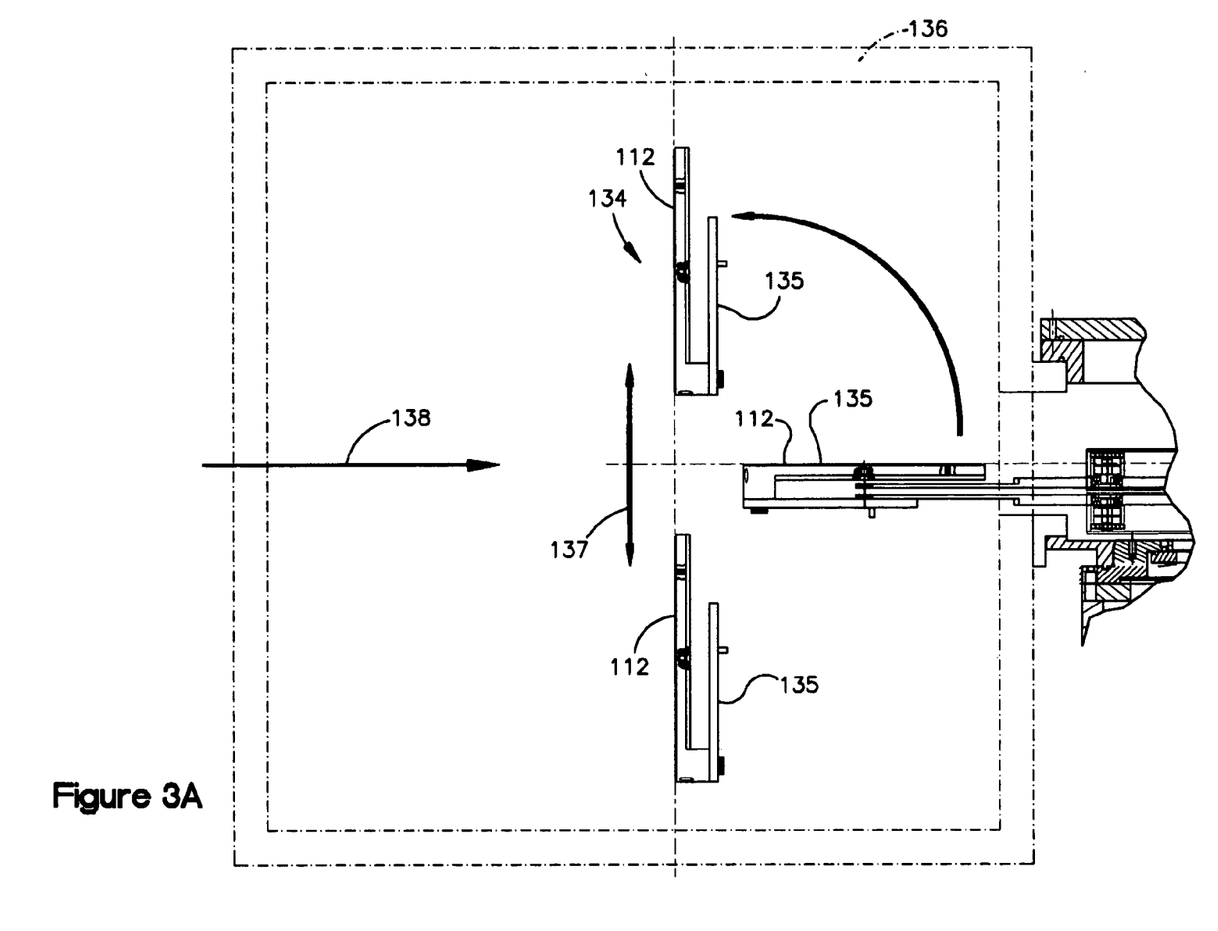
FIG. 3A is a schematic depiction showing a wafer chuck that supports a workpiece within an ion beam for beam treatment of the workpiece.
Figure 4:
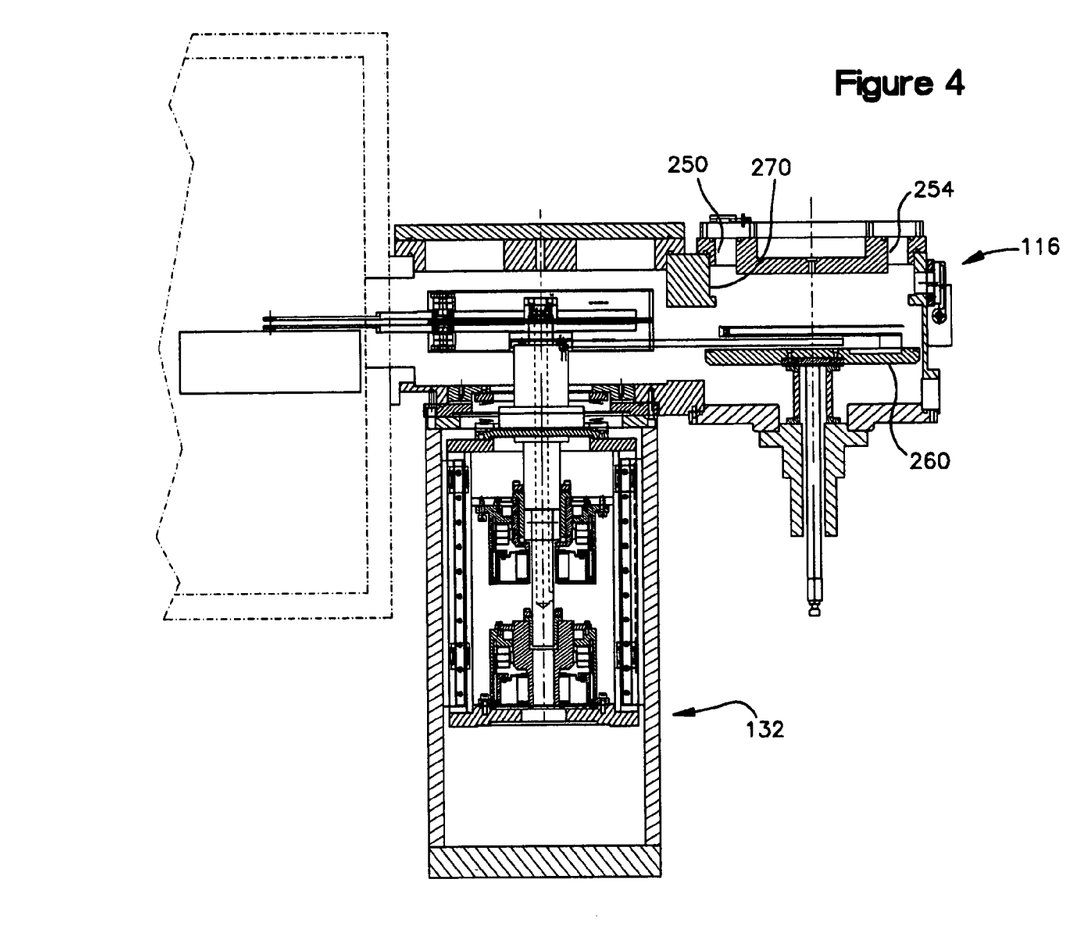
FIG. 4 is an additional section view showing operation of a load lock for delivering workpieces to a lower pressure region of the end station.

The side view of FIGS. 2–4 illustrate details of the in-vacuum robot 132 that moves wafers into the lower pressure region 120 from the load locks 114, 116. As seen in FIG. 2, the robot 132 includes two concentric drive shafts 210, 211 coupled to two individually actuatable motors 214, 215 supported within a robot housing 216. The shafts are supported by and pass through a ferro fluidic seal at the top of the housing 216.

The drive shafts 210, 211 are rotated to selectively orient two sets 230, 232 of robotic arms to controlled positions about a center axis 220. In the depiction of FIG. 1, the shafts 210, 211 have been rotated to position the two sets 230, 232 of arms or end effectors at angles of approximately 90 degrees with respect to each other. Since the sets 230, 232 are individually actuatable, however, any orientation of one set of arms with respect to the other is possible including an orientation where one set directly overlies the other.

As seen in FIG. 1, the first set 230 includes two arms 230a, 230b and the second set has two arms 232a, 232b. A pneumatic actuator (not shown) in the robot causes the arms 230a, 232a to pivot and can be controllably actuated (by a controller that co-ordinates the movements of wafers through the end station 10 depicted in FIG. 1) to grasp a wafer between a pivoting arm 230a, for example, and a second fixed arm 230b. When the pivoting arm 230a (or 232a) moves into contact with a wafer such as the wafer 112, contact pads 234 coupled to the two arms engage a wafer at three points along sides of the wafer. Once the wafer is grasped by the arms, a respective one of the two motors coupled to that set of arms can rotate the wafer to a new position in relation to the center axis of rotation 220.

FIGS. 3 and 4 illustrate section views of a load lock 116 for moving wafers 112, one at a time, into and out of the evacuated region. A load lock housing 250 includes a first throughpassage 252 for venting a load lock housing interior to atmosphere and a second throughpassage 254 coupled to vacuum source (not shown) for lowering the pressure within the load lock housing interior. A pedestal support 260 supports a wafer placed on the support 260 within the load lock housing interior. The load lock 116 has a side entrance 262 that opens and closes to allow the work-pieces (wafers in the exemplary embodiment) to be inserted into the load lock housing interior for placement onto the pedestal support 260. A pneumatic drive 264 coupled to a pressure reservoir raises and lowers the pedestal support 260 and thereby moves the work-pieces within the interior of the load lock 116.

The load lock housing 250 includes walls 270 that bound a first interior region 272 (See FIG. 4) that is accessible from the side entrance 262 and a second interior region 274 (FIG. 3) in fluid communication with a lower pressure region of the implanter that is accessible by the robot's two sets 230, 232 of arms. A top surface 276 of the pedestal forms a peripheral seal around a region of contact of said walls 270 and the pedestal to maintain pressure isolation between the first and second interior regions 272, 274 of the load lock interior. FIG. 3 illustrates a configuration wherein the pedestal is raised to a position for receipt of a work-piece from the higher (typically atmospheric) pressure region of the robot 148 by means of the entrance 262. In this configuration, a door 276 attached to the load lock wall is pivoted open to allow the work-piece to be inserted into the load lock. FIG. 4 illustrates the load lock configuration with the door 276 closed and the pedestal lowered (after a suitable pump down interval) so that the workpiece can be grasped by a set of arms of the robot 132.

The in air robot 148 is of a different design from the design of the robot 132. The in air robot 148 has two end effectors 280 that can cause the work-piece supported by the end effector to translate radially in an out with respect to a center 282 of the robot 148. These end effectors 280 can also pivot around the robot center 282. When the door 276 to the load lock is open, the end effector moves a wafer into the load lock and deposits that wafer onto the pedestal. The robot 148 is a SCARA (selective compliance assembly robot arm) type robot known in the semiconductor treatment industry.

As seen most clearly in FIG. 2, the buffer 130 stores a plurality of thin wafers in a generally parallel configuration for access by said robot. The buffer 130 includes a moveable carriage 290 that includes an array of closely spaced slots into which a generally planar wafer can be inserted. The carriage 290 is mounted to an elevator 292 for up and down movement under control of an ion implanter controller. By moving the carriage along its travel path, the robot 132 can deposit a wafer into a slot. The carriage 290 is then moved up or down so that the robot can grasp a next subsequent wafer from an occupied slot. As mentioned above, the buffer 130 is particularly useful when the ion implanter is used for chained implants.

At a position diametrically opposite from the wafer buffer 130, the end station 110 includes a region 310 for placement of a second buffer, similar to the buffer 130. The region 310 can also be left unoccupied as in the illustrated exemplary embodiment of the invention depicted in FIG. 2. In the illustrated embodiment, the region 310 is evacuated and provides a region through which the arms of the robot 132 can move without having to reverse direction or attempt to move through an inaccessible part of the robot arm travel path such as through a load lock whose pedestal is in a raised position.

Figure 6:
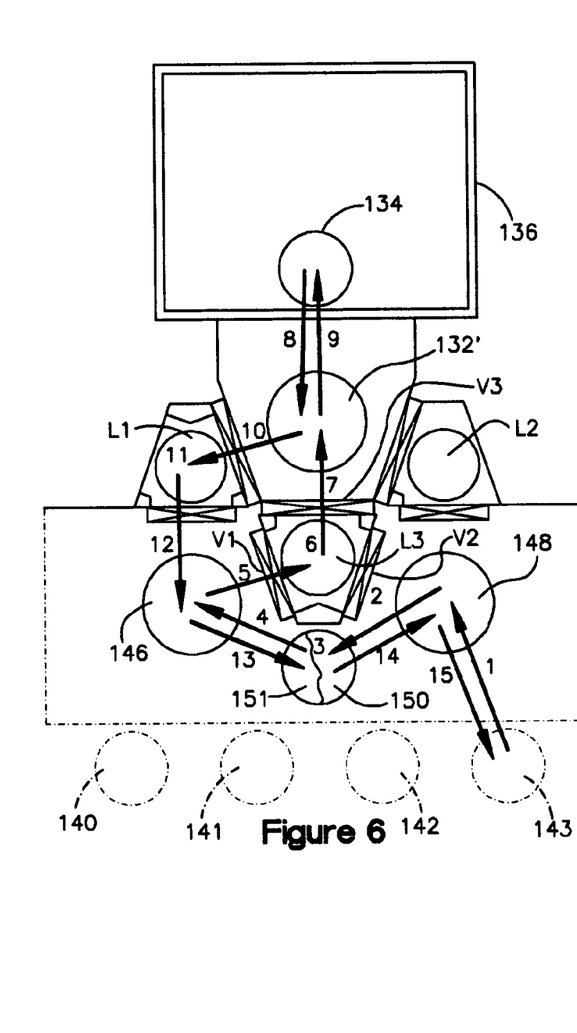
FIGS. 6 and 7 are schematic depictions showing alternate sequences of processing steps for treating a work-piece.

FIG. 6 depicts a sequence of processing steps for serially treating multiple work-pieces at sub-atmospheric pressure at the implanter end station 110. In this depiction a first robot 148 gathers wafers from a rightmost FOUP 143 placed within the higher (atmospheric) pressure region 118. The robot 148 moves the wafer from the FOUP 143 to the aligner 150. Directly above the aligner 150 is a buffering station 151. This buffering station (sized to accommodate a single wafer) provides a location for processed wafers that are being returned to an associated FOUP 143 in the region of the aligner 150. In the FIG. 6 depiction a second robot 146 retrieves the untreated wafer and moves that wafer from the aligner 150 to a first loadlock L3 and places the untreated work-piece onto a pedestal inside the first loadlock. The load lock L3 of FIG. 6 is of a different design than the load lock of FIGS. 2–4. The load lock L3 has two valves V1, V2 on opposite sides of the load lock L3 in approximately the same plane that open for receipt of work-pieces from the two robots 146, 148 (there is no vertically moving elevator or pedestal). A third valve V3 also in the same plane opens to allow access to the evacuated region and specifically the in vacuum robot 132'.

Figure 5:
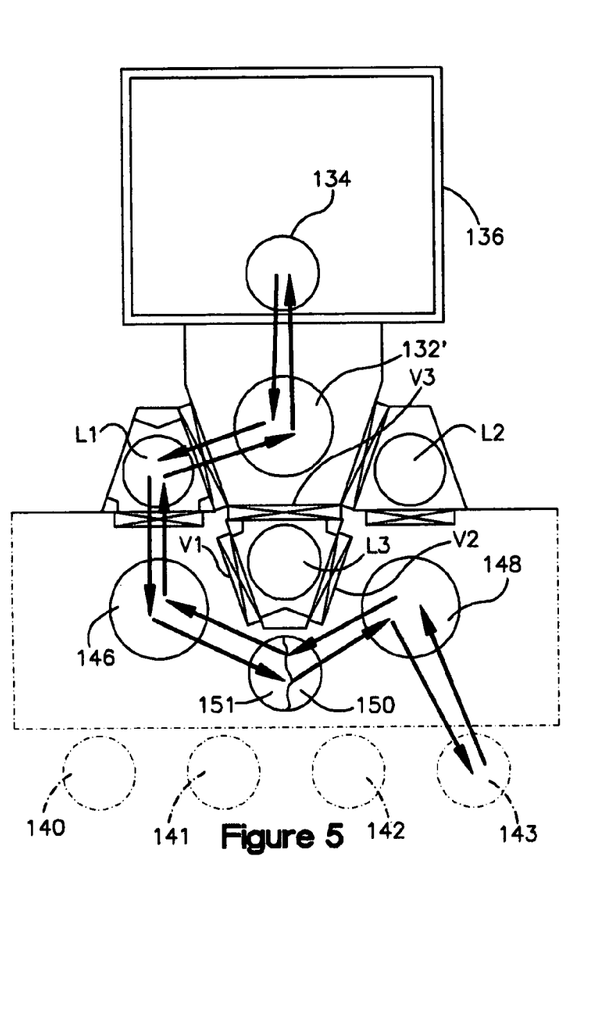
FIG. 5 is a schematic depiction showing one sequence of processing steps for treating a work-piece.
Figure 7:
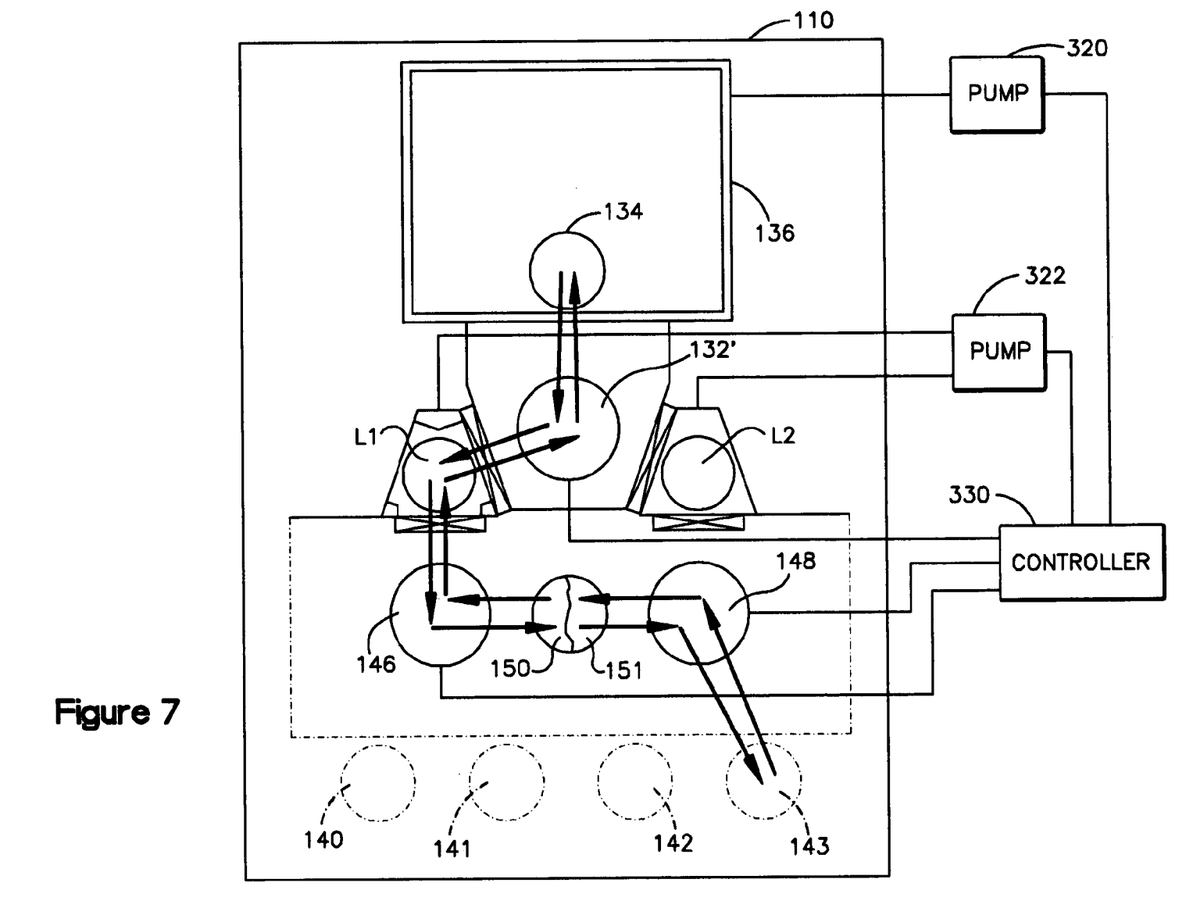

The first load lock L3 is evacuated by a pump (not shown) to reduce the pressure within the first loadlock. An in-vacuum robot 132' moves an end effector radially into the load lock L3 to remove the untreated work-piece from within the interior of the first loadlock. Unlike the robot 132 depicted in FIGS. 2–4, the robot 132' of FIGS. 5–7 is a radially moving type SCARA robot having two sets of arms. In the FIG. 6 depiction, one set of arms retrieves the workpiece from the load lock L3. The robot 132' pivots to face the workpiece treatment station 134. A second set of arms of the in-vacuum robot 132' removes a treated work-piece from a chuck at the treatment station 134 inside the ion implantation chamber 136. The robot 132' then places the untreated work-piece onto the chuck for beam treatment. The robot rotates to a new orientation and places the treated work-piece it retrieved from the chuck into a second load-lock L1. A controller then pressurizes the second loadlock L1 and the second in air robot 146 removes the treated work-piece from the second loadlock L1 for subsequent transfer back to the FOUP 143 through the buffer 151.

FIG. 6 also includes an additional load lock L2. By appropriate programming of a controller that manages end station work-piece movements, this additional loadlock L2 can enhance the efficiency of wafer transfers at the end station. A significant time of the sequence of steps depicted in FIG. 6 is taken up evacuating and venting the loadlocks. Each of the loadlocks L1, L2, L3 accomodates a single wafer. During evacuation or venting of the load lock L3, the robot 148 can retrieve a wafer and insert it into the load lock L2. At the same time the robot 132' can transfer a wafer into the treatment station that was obtained from the load lock L1. Note, the sequence of steps just described do not correspond to the arrows shown in FIG. 6.

FIG. 5 depicts an alternate sequence of processing steps for serially treating multiple work-pieces at sub-atmospheric pressure at the implanter end station 110. The numbers have been omitted from the arrows and process steps in the FIG. 5 sequence of transfers and operations. In this depiction a first robot 148 gathers wafers from a rightmost FOUP 143 at the higher (atmospheric) pressure region 118. In the FIG. 5 depiction the travel segments the workpiece moves through are labeled with arrows corresponding to the path segments and/or processing steps encountered as the wafers are routed into and out of the implantation chamber 136. The robot 148 moves the wafer from the FOUP 143 to the aligner 150 which is located beneath a single wafer buffer 151. In the FIG. 5 depiction a second robot 146 retrieves the untreated wafer and moves that wafer from the aligner 150 to a loadlock L1 places the untreated work-piece onto a pedestal inside the first loadlock.

As a wafer is going into the load lock L1, a second already treated wafer is removed by the robot 146. This transfer can be done in two ways. The load lock L1 can have two wafer trays so that the in air robot 146 can place an untreated wafer on one tray and retrieve an already treated wafer from a second tray. Alternatively, using a SCARA robot 148 such as the robot of FIG. 3, that includes two end effectors, a load lock L1 with a single tray can be used. One effector obtains the treated wafer and the second effector places an untreated wafer onto the now available load lock tray. The load lock L1 is then evacuated by a pump (not shown) to reduce the pressure within the first loadlock.

An in-vacuum robot 132' moves one set of arms into the load lock L1 to remove the untreated work-piece from within the interior of the first load lock. The second set of arms then places a treated work-piece from the previous treatment cycle into the load lock for subsequent repressurization and return to the FOUP. The in-vacuum robot 132' then rotates to to move the untreated work-piece to the treatment station 134. The second, unoccupied set of arms of the in-vacuum robot 132' removes a treated work-piece from the treatment station 134 inside the ion implantation chamber 136. The in-vacuum robot 132' moves the untreated work-piece (obtained from load lock L1) into the chamber 136 for treatment. The robot 132' then rotates to a second load lock L2 or L3 to place the treated work-piece into the load lock L2 or L3. A controller 330 then pressurizes the load lock L2 or L3 and in the in-air robot 148 removes the treated work-piece from the load lock L2 or L3 for subsequent transfer back to the FOUP 143."

FIG. 7 depicts an alternate sequence of processing steps for serially treating multiple work-pieces at sub-atmospheric pressure at the implanter end station 110 that is similar to the depiction of FIG. 5. In FIG. 7 a first robot 148 gathers wafers from a rightmost FOUP 143 at the higher (atmospheric) pressure region 118. The robot 148 moves the wafer from the FOUP 143 to the aligner 150 which is located beneath a single wafer buffer 151. A second robot 146 retrieves the untreated wafer and moves that wafer from the aligner 150 to a loadlock L1 and places the untreated work-piece onto a pedestal inside the loadlock L1.

As a wafer is going into the load lock L1, a second already treated wafer is removed. This transfer can be done in two ways. The load lock L1 can have two wafer trays so that the in air robot 146 can place an untreated wafer on one tray and retrieve an already treated wafer from a second tray. Alternatively, using a SCARA robot such as the robot of FIG. 3, that includes two end effectors, a load lock L1 with a single tray can be used. One effector obtains a treated wafer and the second effector places an untreated wafer onto the now available (empty) load lock tray. The load lock L1 is then evacuated by a pump (not shown) to reduce the pressure within the first loadlock. An in-vacuum robot 132' rotates one set of arms into the load lock L1 to remove the untreated work-piece from within the interior of the first loadlock. One set of arms retrieves the workpiece from the load lock L1 and a second set of arms of the in-vacuum robot 132' places a treated wafer into the load lock. The robot moves the untreated work-piece to the treatment station. A controller then pressurizes the loadlock L1 and the in air robot 146 removes the treated work-piece from the loadlock L1 for subsequent transfer back to the FOUP 143 through the buffer 151. As discussed above with reference to FIG. 6, each of the end stations shown in FIGS. 5 and 7 have multiple load locks to enhance the efficient throughput of wafers into and out of the treatment station 134.

FIGS. 5–7 each define end stations 110 for serially treating multiple work-pieces at sub-atmospheric pressure. At least one robot 132' has two sets of end effectors which rotate about a robot center axis for moving work-pieces to a treatment station 134. A second robot 146 or 148 outside the subatmospheric region moves an untreated work-piece to a first loadlock L1, L2, or L3 and places the untreated work-piece inside the first loadlock. A pump 322 (separate from the pump 320 coupled to the implantation chamber 136) under the control of a controller 330 evacuates the first loadlock to reduce the pressure within the first loadlock. The controller 330 then causes the first robot 132' to remove the untreated work-piece from the first loadlock with one set of end effectors of the first robot 132'. The controller 330 also causes a treated work-piece obtained from the treatment station to be obtained with a second set of end effectors of the first robot 132' and moved into the first loadlock prior to pressurizing the load lock.

It is the intent that although the invention has been described with a degree of particularity, the invention includes all modifications and alterations from the disclosed exemplary embodiment falling within the spirit or scope of the appended claims.

The invention claimed is:

1. For use with a tool for treating a work-piece at sub-atmospheric pressure, transfer apparatus comprising:
    a) one or more work-piece isolation load locks for transferring multiple work-pieces at a time from a higher pressure region to a lower pressure region and back to said higher pressure region, wherein each load lock is subjected to a pressurization and evacuation cycle in order to transfer the multiple work-pieces between the higher and lower pressure regions;
    b) a buffer that is maintained at the lower pressure during successive pressurization and evacuation cycles of the load lock, the buffer being for storing a plurality of work-pieces at the lower pressure in positions within the buffer accessible for automated transfer into and out of said buffer; and
    c) a robot including multiple independently operable transfer arms having a common pivot axis for transferring work-pieces from the work-piece load lock to the buffer or to a work-piece treatment station maintained at said lower pressure.

2. The transfer apparatus of claim 1 additionally comprising a work-piece aligner for controlling an alignment of work-pieces moved through the work-piece isolation load lock.

3. The transfer apparatus of claim 1 wherein the buffer stores a plurality of thin wafers in a generally parallel configuration for access by said robot.

4. The transfer apparatus of claim 1 wherein the isolation load lock comprises:
    a load lock housing that includes a first throughpassage for venting a load lock housing interior to atmosphere and a second throughpassage for lowering the pressure within the load lock housing interior;
    a pedestal support for supporting a wafer placed on the support within the housing interior;
    a side entrance that opens and closes to allow the work-pieces to be inserted into the load lock housing interior for placement onto the pedestal support; and
    an actuator for raising and lowering the pedestal support and thereby move the workpieces within the housing interior.

5. The transfer apparatus of claim 4 wherein the load lock housing includes walls that define a first interior region that includes the side entrance and a second interior region in fluid communication with a lower pressure region that is accessible to the robot.

6. The transfer apparatus of claim 5 wherein a surface of the pedestal forms a seal along a region of contact of said walls to maintain pressure isolation between the first and second interior regions of the load lock interior.

7. The transfer apparatus of claim 1 wherein the isolation load lock comprises:
    a load lock housing that includes a first valve for exposing a load lock housing interior to atmosphere and a second valve for exposing a load lock housing interior to a vacuum region; and
    a workpiece support for supporting a workpiece within the housing interior after said workpiece is moved into the housing interior through either said first or second valves.

8. For use with a tool for treating a work-piece at sub-atmospheric pressure, transfer apparatus comprising:

a) an enclosure defining a low pressure region for treatment of work-pieces placed at a work-piece treatment station within the low pressure region;
b) multiple work-piece isolation load locks for transferring work-pieces, one or two at a time, from higher pressure to lower pressure for treatment and back to said higher pressure subsequent to said treatment, wherein the load locks undergo a pressurization and evacuation cycle to transfer the one or two work-pieces between the higher pressure and the lower pressure;
c) a first robot including multiple independently operable transfer arms having a common pivot axis for transferring work-pieces within low pressure region from the load locks to a treatment station within the low pressure region;
d) multiple other robots positioned outside the low pressure region for transferring work-pieces to and from the multiple work-piece isolation load locks from a source of said work-pieces prior to treatment and to a destination of said work-pieces after said treatment; and
e) a low pressure buffer that is maintained at lower pressure dining successive pressurization and evacuation cycles of the load lock, the buffer being for storing a plurality of work-pieces at the lower pressure in positions within the buffer accessible for automated transfer into and out of said buffer.

9. The transfer apparatus of claim 8 wherein the source and the destination are a single storage device that is capable of holding multiple work-pieces.

10. The transfer apparatus of claim 8 additionally comprising a work-piece aligner for controlling an alignment of work-pieces moved through the work-piece isolation load lock.

11. The transfer apparatus of claim 8 wherein the buffer stores a plurality of this wafers in a generally parallel configuration for access by the robot.

12. The transfer apparatus of claim 8 wherein the isolation load locks comprise:
   a load lock housing that includes a first throughpassage for venting a load lock housing interior to atmosphere and a second through passage for lowering the pressure within the load lock housing interior;
   a pedestal support for supporting a wafer placed on the support within the housing interior;
   a side entrance that opens and closes to allow the work-pieces to be inserted into the load lock housing interior for placement onto the pedestal support; and
   an actuator for raising and lowering the pedestal support and thereby move the workpieces within the housing interior.

13. The transfer apparatus of claim 12 wherein the load lock housing includes walls that define a first interior region that includes the side entrance and a second interior region in fluid communication with a lower pressure region that is accessible to the first robot.

14. The transfer apparatus of claim 13 wherein a surface of the pedestal forms a seal along a region of contact of said walls to maintain pressure isolation between the first and second interior regions of the load lock interior.

15. The transfer apparatus of claim 8 where the isolation load locks comprise:
   a load lock housing tat includes a first valve for exposing a load lock housing interior to atmosphere and a second valve for exposing a load lock housing interior to a vacuum region; and
   a workpiece support for supporting a workpiece within the housing interior alter said workpiece is moved into the housing interior through either said first or second valves.

* * * * *